(12) United States Patent
Shibata

(10) Patent No.: US 7,804,207 B2
(45) Date of Patent: Sep. 28, 2010

(54) POSITIONING APPARATUS, EXPOSURE APPARATUS, AND DEVICE MANUFACTURING METHOD USING REPULSION FORCE GENERATION

(75) Inventor: Yugo Shibata, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 294 days.

(21) Appl. No.: 11/874,482

(22) Filed: Oct. 18, 2007

(65) Prior Publication Data

US 2008/0100149 A1 May 1, 2008

(30) Foreign Application Priority Data

Oct. 27, 2006 (JP) ............... 2006-293154

(51) Int. Cl.
*H02K 41/03* (2006.01)
*H02K 41/00* (2006.01)
(52) U.S. Cl. ............... 310/12.31; 310/12.05; 355/53
(58) Field of Classification Search ............ 310/12.01, 310/12.31, 12.05, 12.06; 355/53, 75
See application file for complete search history.

(56) References Cited

U.S. PATENT DOCUMENTS 3,614,181 A * 10/1971 Meeks ............... 310/90.5
4,890,023 A * 12/1989 Hinds et al. ............... 310/12.15
6,144,118 A * 11/2000 Cahill et al. ............ 310/12.06
6,177,978 B1 * 1/2001 Korenaga ............... 355/53
6,903,468 B2 * 6/2005 Korenaga ............... 310/12.19
2007/0222303 A1 * 9/2007 Nishimura ............... 310/12
2008/0001482 A1 * 1/2008 Ohishi ............... 310/12
2008/0100149 A1 * 5/2008 Shibata ............... 310/12
2008/0169708 A1 * 7/2008 Shibata ............... 310/12
2008/0170213 A1 * 7/2008 Ohishi ............... 355/53

FOREIGN PATENT DOCUMENTS

JP        2004-079639        3/2004

* cited by examiner

*Primary Examiner*—Karl I Tamai
(74) *Attorney, Agent, or Firm*—Rossi, Kimms & McDowell LLP

(57) ABSTRACT

This invention provides a positioning apparatus which improves the throughput by accelerating a stage in a shorter period of time while ensuring a fine positioning characteristic. A movable element is arranged on the side of a stage while a stator is arranged on the side of a base guide such that a pair of magnets of the same polarity face each other at each edge of the stroke region of the stage. This generates a repulsion force which acts against the thrust of the stage and corresponds to the facing area of the pair of magnets of the same polarity. The positioning apparatus further includes a large-thrust linear motor. The large-thrust linear motor assists the repulsion force by applying a thrust exceeding the repulsion force to the stage to increase the facing area of the pair of magnets of the same polarity.

2 Claims, 10 Drawing Sheets

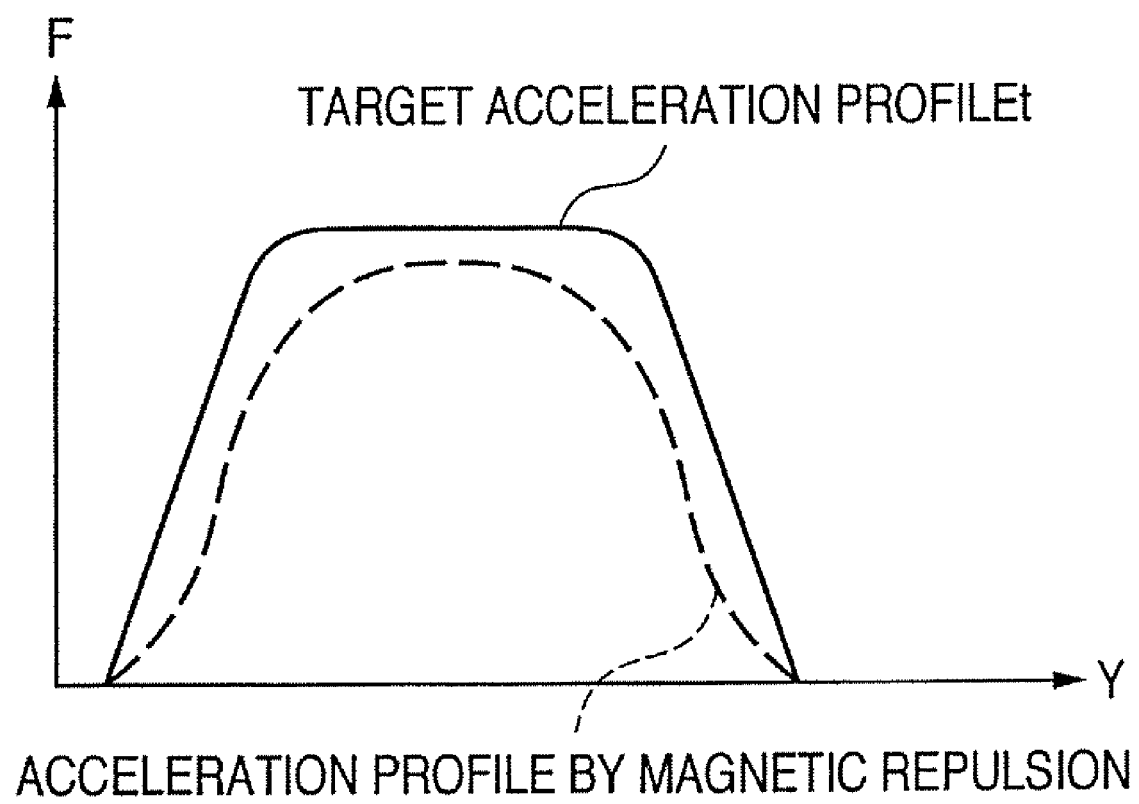

POSITIONING APPARATUS, EXPOSURE APPARATUS, AND DEVICE MANUFACTURING METHOD USING REPULSION FORCE GENERATION

BACKGROUND OF THE INVENTION

1. Field of the Invention

The present invention relates to a positioning apparatus, exposure apparatus, and device manufacturing method used for, for example, a semiconductor manufacturing apparatus.

2. Description of the Related Art

One index of the performance of a semiconductor manufacturing apparatus is the throughput which indicates the number of wafers it can process per unit time. To attain a high throughput, a scanner exposure apparatus, in particular, is required to move a reticle stage which supports a reticle master at high speed by increasing the acceleration/deceleration. However, the acceleration schemes using conventional linear motors lead to high power consumption and high driver output voltage.

Under the circumstances, Japanese Patent Laid-Open No. 2004-79639 proposes a technique of arranging large-thrust acceleration repulsion magnets at the two ends of the stage to perform high-accuracy control using a control linear motor while suppressing electric current consumption upon acceleration.

FIGS. 6A and 6B show an arrangement of a conventional positioning apparatus. FIG. 6A is a plan view of the conventional positioning apparatus, and FIG. 6B is a front view. In this positioning apparatus, a base guide 102 is fixed to a main body base 101, and a stage 104 which mounts a processing object 103 is supported to be movable in one axial direction with respect to the base guide 102.

A bearing 114 inserted between the upper surface of the base guide 102 and the lower surface of the stage 104 regulates the orientation of the stage 104. Linear motor movable elements 105 are fixed to both sides of the stage 104. A linear motor stator 106 faces the linear motor movable element 105 in a noncontact manner and is fixed to the main body base 101. The position of the stage 104 is measured by irradiating a reflection mirror 117 with a laser beam from a laser interferometer.

This positioning apparatus comprises repulsion magnet units each having a detailed arrangement as shown in FIG. 7. Repulsion movable elements 107 each including a movable magnet holder 108 and movable magnet 109 are fixed at the front and back ends of the stage 104. The movable magnet 109 is a plate-like unipolar permanent magnet magnetized in the vertical direction. In this prior art, the upper surface of the movable magnet 109 is magnetized into an N pole. The repulsion movable element 107 acts as an inserted magnet which interacts with a repulsion stator 110 arranged on the base guide 102 to apply a repulsion force to the stage 104, thereby accelerating/decelerating the stage 104.

A characteristic feature of the above-described arrangement of the repulsion magnet unit is that the direction in which it generates a repulsion force is perpendicular to the magnetization direction of the permanent magnet. For example, even when identical poles of magnets magnetized in the Y direction are set to face each other, it is possible to obtain a repulsion force in the Y direction. In this case, however, the distance along which the repulsion magnet unit can generate a repulsion force is too short to attain a sufficiently high speed. In contrast, as shown in FIG. 7, a pair of magnets of the same polarity are set to face each other to utilize a force generated in a direction perpendicular to the direction they face each other. This makes it possible to obtain a force generation stroke corresponding to the sizes of the pair of magnets of the same polarity which face each other. In addition, the repulsion magnet unit has a structure in which upper and lower magnets 112 sandwich the respective pole faces of the movable magnet 109 from both sides. This makes it possible to cancel a repulsion force in the direction they face each other.

The repulsion stators 110 which apply an acceleration/deceleration force to the stage 104 are fixed on the base guide 102 in correspondence with the repulsion movable elements 107. The repulsion stator 110 is set at each edge of the stroke region of the stage 104. The repulsion stator 110 acts as a magnet group including an upper yoke 111, the upper magnet 112, two side yokes 113, the lower magnet 112, and a lower yoke 111. The upper and lower magnets 112 are plate-like unipolar permanent magnets magnetized in the vertical direction, like the repulsion movable element 107. The poles of the upper and lower magnets 112 face identical poles of the repulsion movable element 107. That is, the lower surface of the upper magnet 112 corresponds to an N pole, while the upper surface of the lower magnet 112 corresponds to an S pole. The upper yoke 111, side yokes 113, and lower yoke 111 are provided so that the magnetic fluxes of the upper and lower magnets 112 run through them sideways.

The interval between the upper and lower magnets 112 is slightly larger than the thickness of the movable magnet 109, while that between the two side yokes 113 is wider than the width of the movable magnet 109. The movable magnet 109 can be inserted into a hole in a noncontact manner, which is formed among the pair of upper and lower magnets 112 and two side yokes 113.

A method of accelerating the stage 104 will be explained next. First, the linear motors 105 and 106 accelerate the stage 104 in, for example, the +Y direction while no repulsion force of the repulsion magnet unit acts on the stage 104, that is, while the repulsion movable element 107 is not inserted in the repulsion stator 110. As the stage 104 gradually picks up speed using the linear motors 105 and 106, it reaches the repulsion force acting region of the repulsion magnet unit. At this point, the repulsion movable element 107 starts to be inserted into the repulsion stator 110 so that the repulsion magnet unit begins to accumulate a repulsion force in the −Y direction. An electric current which acts against the repulsion force flows through the linear motors 105 and 106.

In this state, when the electric current flowing through the linear motors 105 and 106 is set to zero, the stage 104 accelerates in the −Y direction upon receiving the repulsion force. As the repulsion movable element 107 is pushed out of the inserted position upon receiving the repulsion force in the direction indicated by an arrow A, the repulsion force decreases. When the repulsion movable element 107 sufficiently separates from the repulsion stator 110, the repulsion force becomes zero. Since the stage 104 accelerates to a maximum speed corresponding to the amount of insertion and is guided by the bearing 114, it moves to the opposite side while keeping this speed. The stage 104 then reaches the repulsion force acting region of the repulsion magnet unit on the opposite side. The kinetic energy of the stage 104 is conserved until the repulsion movable element 107 on the opposite side of the stage 104 interacts with the repulsion stator 110 at the other end. Hence, the speed of the repulsion movable element 107 on the opposite side of the stage 104 also becomes zero while it is inserted into the repulsion stator 110 at the other end by the same amount of insertion as that of the first time.

The linear motors 105 and 106 accelerate the stage 104 in the −Y direction while it further moves in the −Y direction. This makes it possible to further increase the amount of insertion of the repulsion movable element 107 in the repulsion stator 110 than that of the first time. That is, the repulsion magnet unit can accumulate a repulsion force in the +Y direction, that is larger than that of the first time.

In this way, the stage 104 reciprocates a plurality of number of times with acceleration to gradually increase the insertion amount, that is, the repulsion force. Upon eventually achieving a desired amount of insertion, the repulsive acceleration unit will have accumulated a desired repulsion force to actuate the stage 104 at a desired acceleration force.

Unfortunately, the above-described conventional positioning apparatus poses the following problems.

That is, to apply a maximum acceleration force from the repulsion magnet unit to the stage, it is necessary to gradually increase the acceleration force by a plurality of number of times of reciprocating actuation. This disturbs an improvement of the throughput. To accumulate the repulsion force of the repulsion magnet unit only by the forces of the linear motors, they require large thrusts. In particular, a high-acceleration linear motor for, for example, an exposure apparatus must be of not a coreless type but a core type. However, the core type linear motor suffers cogging owing to the positional relationship between the magnet and the core. This cogging acts as a disturbance in a stage control region which requires fine positioning, resulting in a failure in obtaining a fine positioning characteristic. Still worse, the core type linear motor increases the apparatus size and generates high heat.

SUMMARY OF THE INVENTION

It is an object of the present invention to attain a positioning apparatus which can contribute to improving the throughput by accelerating a stage in a shorter period of time while ensuring a fine positioning characteristic.

According to one aspect of the present invention, a positioning apparatus which improves the throughput by accelerating a stage in a shorter period of time while ensuring a fine positioning characteristic is provided. A movable element is arranged on the side of a stage while a stator is arranged on the side of a base guide such that a pair of magnets of the same polarity face each other at each edge of the stroke region of the stage. This generates a repulsion force which acts against the thrust of the stage and corresponds to the facing area of the pair of magnets of the same polarity. The positioning apparatus further includes a large-thrust linear motor. The large-thrust linear motor assists the repulsion force by applying a thrust exceeding the repulsion force to the stage to increase the facing area of the pair of magnets of the same polarity.

Further features of the present invention will become apparent from the following description of exemplary embodiments with reference to the attached drawings.

BRIEF DESCRIPTION OF THE DRAWINGS

FIG. 3 is a schematic graph showing an acceleration profile according to the first embodiment of the present invention;

DESCRIPTION OF THE EMBODIMENTS

Various exemplary embodiments, features, and aspects of the present invention will be described in detail below with reference to the drawings.

First Embodiment

Figure 1A:
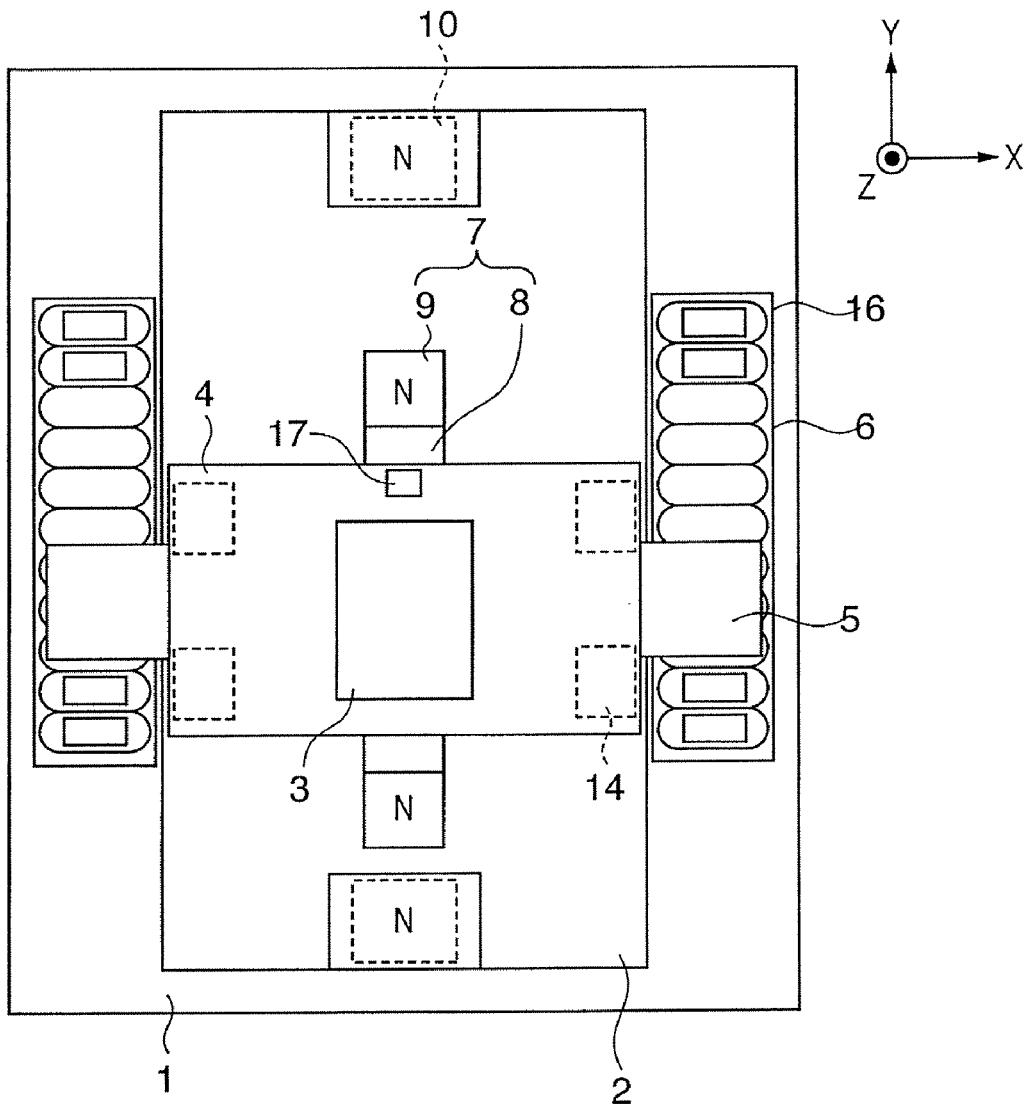
FIGS. 1A and 1B are views showing the arrangement of a positioning apparatus according to the first embodiment of the present invention.
Figure 1B:
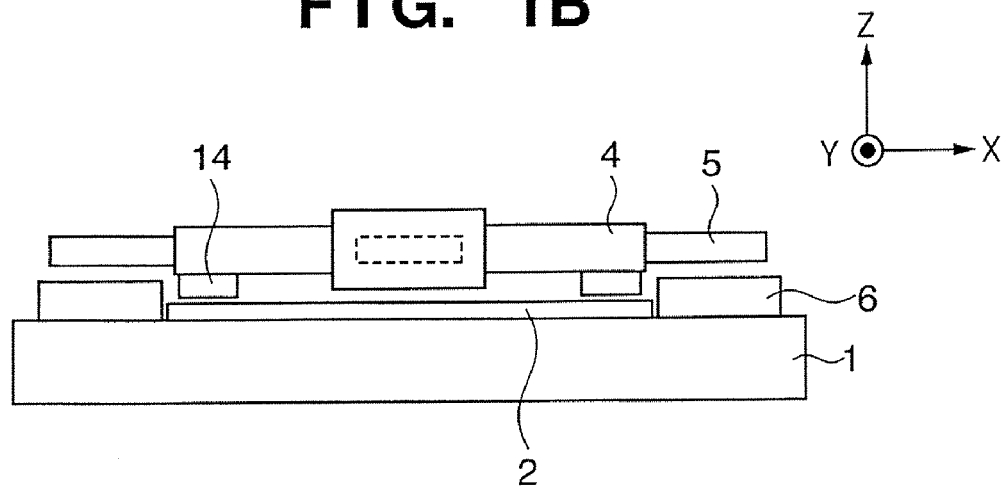

FIGS. 1A and 1B show the arrangement of a positioning apparatus according to the first embodiment. FIG. 1A is a plan view, and FIG. 1B is a front view. Referring to FIGS. 1A and 1B, reference numeral 1 denotes a main body base; 2, a base guide; 3, a processing object; 4, a stage; 5, a linear motor movable element; 6, a high-accuracy linear motor stator; 7, a repulsion movable element; 10, a repulsion stator; 14, a static pressure air pad serving as a bearing; 16, a large-thrust linear motor stator; and 17, a reflection mirror.

In this positioning apparatus, the base guide 2 is fixed to the main body base 1, and the stage 4 which mounts the processing object 3 is supported to be movable in one axial direction with respect to the base guide 2. The bearing 14 inserted between the upper surface of the base guide 2 and the lower surface of the stage 4 regulates the orientation of the stage 4. A semiconductor exposure apparatus required to attain high-accuracy positioning adopts an air bearing as the bearing 14. The linear motor movable elements 5 are fixed to both sides of the stage 4. The high-accuracy linear motor stator 6 and large-thrust linear motor stator 16 face the linear motor movable element 5 in a noncontact manner. The high-accuracy linear motor stator 6 and large-thrust linear motor stator 16 are fixed in a stage control region and repulsion force acting region, respectively, on the main body base 1. The stage control region is free from any repulsion force. The repulsion force acting region is subjected to the repulsion force of a repulsion magnet unit. The position of the stage 4 is measured by irradiating the reflection mirror 17 with a laser beam from a laser interferometer.

Figure 2:
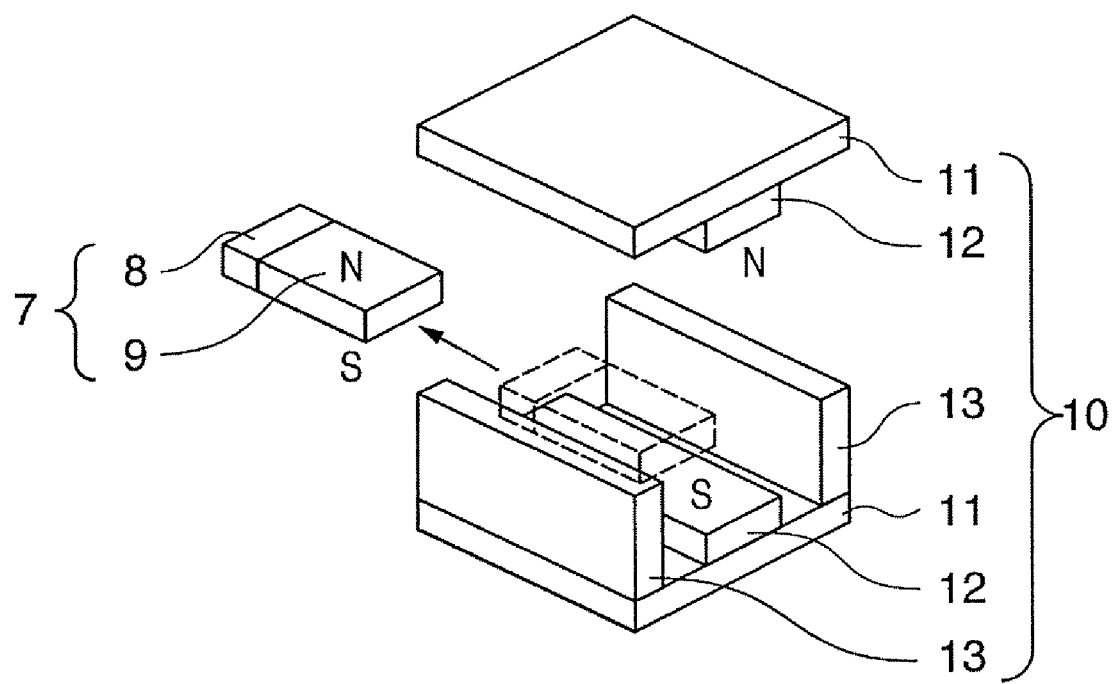
FIG. 2 is a view showing the arrangement of a repulsion magnet unit according to the first embodiment of the present invention.

This positioning apparatus comprises repulsion magnet units shown in FIG. 2. The repulsion movable elements 7 each including a movable magnet holder 8 and movable magnet 9 are fixed at the front and back ends of the stage 4. The movable magnet 9 is a plate-like unipolar permanent magnet magnetized in the vertical direction. In the first embodiment, the upper surface of the movable magnet 9 is magnetized into an N pole. The repulsion movable element 7 acts as an inserted magnet which interacts with the repulsion stator 10 arranged on the base guide 2, to apply a repulsion force to the stage 4, thereby accelerating/decelerating the stage 4.

In addition, the repulsion magnet unit has a structure in which upper and lower magnets 12 sandwich the respective pole faces of the movable magnet 9 from both sides. This makes it possible to cancel a repulsion force in the vertical direction, that is, the direction in which the magnets face each other. The repulsion stators 10 which apply an acceleration/deceleration force to the stage 4 are fixed on the base guide 2 in correspondence with the repulsion movable elements 7. The repulsion stator 10 is set at each edge of the stroke region of the stage 4.

The repulsion stator 10 acts as a magnet group including an upper yoke 11, the upper magnet 12, two side yokes 13, the lower magnet 12, and a lower yoke 11. The upper and lower magnets 12 are plate-like unipolar permanent magnets magnetized in the vertical direction, like the repulsion movable element 7. However, the poles of the upper and lower magnets 12 face identical poles of the repulsion movable element 7. That is, the lower surface of the upper magnet 12 corresponds to an N pole, while the upper surface of the lower magnet 12 corresponds to an S pole. The upper yoke 11, side yokes 13, and lower yoke 11 are provided so that the magnetic fluxes of the upper and lower magnets 12 run through them sideways. The yokes may be omitted depending on the arrangement of the magnetic circuit. The interval between the upper and lower magnets 12 is slightly larger than the thickness of the movable magnet 9, while that between the two side yokes 13 is wider than the width of the movable magnet 9. The movable magnet 9 can be inserted into a hole in a noncontact manner, which is formed among the pair of upper and lower magnets 12 and two side yokes 13. Controlling the amount of insertion makes it possible to adjust the facing area of the pair of magnets of the same polarity. This makes it possible to control the repulsion force which acts against the thrust of the stage 4 and corresponds to the facing area.

A method of accelerating the stage 4 will be explained next.

In the initial state, the stage 4 is normally present in the stage control region free from any repulsion force of the repulsive acceleration magnet. In this state, the high-accuracy linear motors 5 and 6 serving as actuating means move the stage 4 to the movable region of the high-accuracy linear motors 5 and 6, that is, the repulsion force acting region. The large-thrust linear motors 5 and 16 serving as repulsion force assisting means move the stage 4 until it receives a desired repulsion force, and insert the repulsion movable element 7 in the repulsion stator 10. The large-thrust linear motors 5 and 16 are of a large thrust type which generates a thrust exceeding the repulsion force of the repulsion magnet unit. While the large-thrust linear motors 5 and 16 accumulate the repulsion force of the repulsion magnet unit, an electric current which acts against the repulsion force flows through the large-thrust linear motor stator 16. In this state, when the electric current flowing through the large-thrust linear motor stator 16 is set to zero, the stage 4 accelerates in the opposite direction upon receiving the repulsion force.

The large-thrust linear motors 5 and 16 further perform positioning servo or speed servo control for the stage 4. This assists the repulsion magnet unit in acceleration to shape an acceleration waveform generated by the repulsion force of the repulsion magnet unit into a speed profile with better reproducibility. To attain acceleration with a larger thrust, the actuation direction of the large-thrust linear motors 5 and 16 is desirably the same as that of the repulsion force of the repulsion magnet unit. That is, an acceleration profile with a larger thrust is generated by assisting the repulsion force of the repulsion magnet.

FIG. 3 is a graph schematically showing that state. Referring to FIG. 3, the broken line indicates an acceleration profile exhibited by the repulsion magnet unit, and the solid line indicates a desired acceleration profile. Since the repulsion magnet unit mainly performs acceleration, positioning or speed servo control by the large-thrust linear motors 5 and 16 need only assist it. As is obvious from FIG. 3, since the repulsion magnet unit produces most of a necessary acceleration force, the large-thrust linear motors 5 and 16 need only produce a relatively small force.

As the repulsion movable element 7 is pushed out of the inserted position upon receiving the repulsion force, the repulsion force decreases. After the repulsion movable element 7 sufficiently separates from the repulsion stator 10 and passes through the repulsion force acting region, the repulsion force becomes zero. After passing through the repulsion force acting region, the repulsion movable element 7 enters the stage control region of the high-accuracy linear motors 5 and 6 at a desired speed. The high-accuracy linear motors 5 and 6 then move the repulsion movable element 7 at a constant speed. The repulsion movable element 7 enters the repulsion force acting region on the opposite side again, and the repulsive acceleration unit accumulates a repulsion force again. The speed of the repulsion movable element 7 on the opposite side of the stage 4 also becomes zero while it is inserted in the repulsion stator 10 at the other end by the same amount of insertion as that of the first time, that is, a desired amount of insertion. Repeating a series of these operations achieves high-acceleration actuation.

One conventional problem is that to actuate a high-acceleration stage using a repulsion magnet unit, it is necessary to perform an initial acceleration preparation operation a plurality of number of times of reciprocating actuation, resulting in a failure in improving the throughput. In contrast, the positioning apparatus according to the present invention need only perform the initial acceleration preparation operation once using the large-thrust linear motors 5 and 16 to achieve a desired amount of insertion of the repulsion movable element 7 in the repulsion stator 10. The repulsion magnet unit can thus accumulate a desired repulsion force. That is, the positioning apparatus need only perform the initial acceleration operation once to actuate the stage 4 with a desired acceleration force. This greatly improves the throughput.

It has conventionally been necessary to use core type linear motors as the large-thrust linear motors 5 and 16 in order to insert the repulsion movable element 7 in the repulsion stator 10 against the repulsion force of the repulsion magnet unit. Since the conventional technique causes a core type linear motor having a single large thrust to perform even accurate control, the positioning characteristic in the stage control region suffers due to cogging. In contrast, the positioning technique according to the first embodiment causes the high-accuracy linear motors 5 and 6 to perform accurate control while causing the large-thrust linear motors 5 and 16 different from them to perform the initial acceleration preparation operation and acceleration assistance with a large thrust. That is, according to the first embodiment, the high-accuracy linear motors 5 and 6 can adopt coreless type linear motors free from any cogging. This makes it possible to obtain high acceleration and a high-accuracy positioning characteristic in the stage control region at the same time.

The linear motors 5 and 6 need not always be of the coreless type because no cogging occurs as long as yokes having uniform shapes are fixed to them. Even with this arrangement, the repulsion magnet unit can accumulate a desired repulsion force only by performing the initial acceleration preparation operation once. That is, performing the initial acceleration preparation operation once makes it possible to actuate the stage with a desired acceleration force, resulting in an improvement of the throughput. Still better, it is possible to attain a high-accuracy positioning characteristic free from any cogging.

Second Embodiment

Figure 4A:
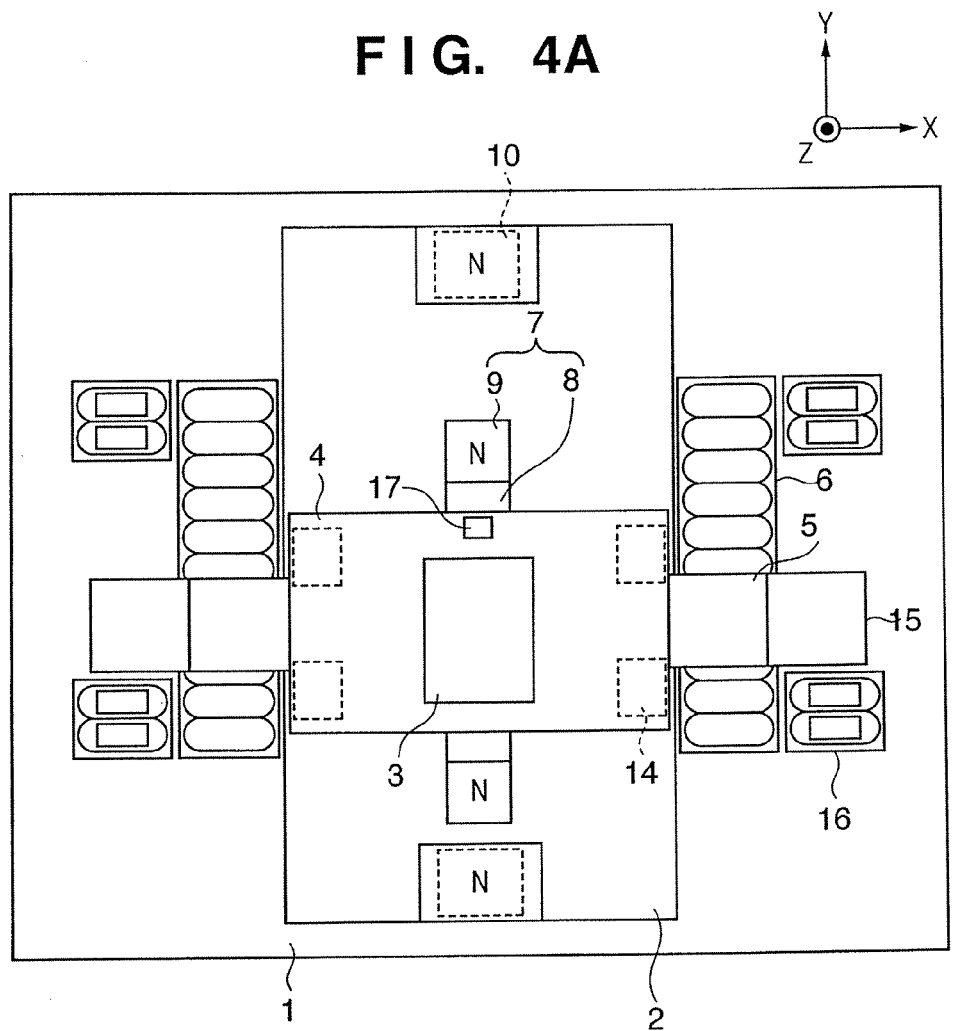
FIGS. 4A and 4B are views showing the arrangement of a positioning apparatus according to the second embodiment of the present invention.
Figure 4B:
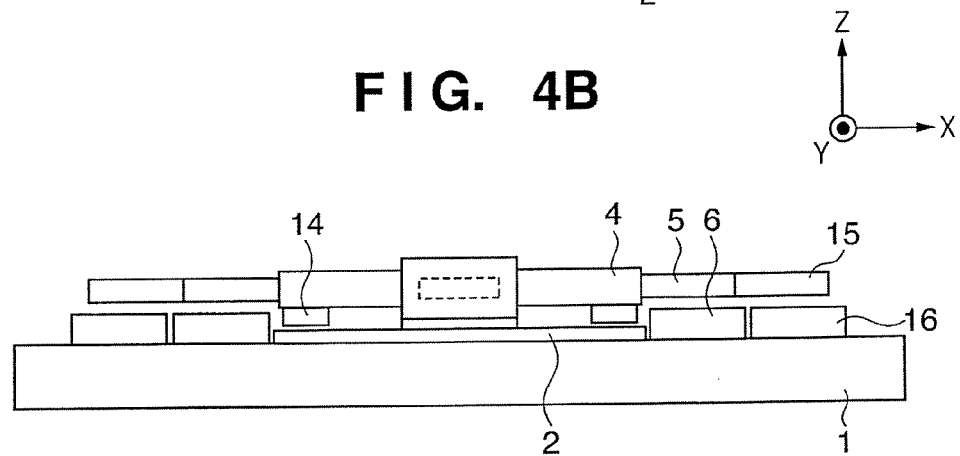

FIGS. 4A and 4B show the arrangement of a positioning apparatus according to the second embodiment. FIG. 4A is a plan view, and FIG. 4B is a front view. The same reference numerals as in FIGS. 1A and 1B denote the same constituent elements in FIGS. 4A and 4B.

In the second embodiment, linear motor movable elements are separately prepared for large-thrust and high-accuracy linear motors. High-accuracy linear motors 5 and 6 are of a coreless type, while large-thrust linear motors 15 and 16 are of a core type. The high-accuracy linear motors 5 and 6 allow fine positioning control for the entire stroke region including a repulsion force acting region. The other operations in the second embodiment are the same as those in the first embodiment, and a description thereof will not be repeated.

As a control method, the large-thrust linear motors 15 and 16 desirably assist acceleration to obtain a desired speed profile, as in the first embodiment. Alternatively, the high-accuracy linear motors 5 and 6 desirably correct coggings generated by the large-thrust linear motors 15 and 16 while the large-thrust linear motors 15 and 16 assist acceleration. This makes it possible to generate an acceleration profile with a higher accuracy by suppressing accuracy deterioration due to the coggings of the core type linear motors.

Third Embodiment

Figure 5A:
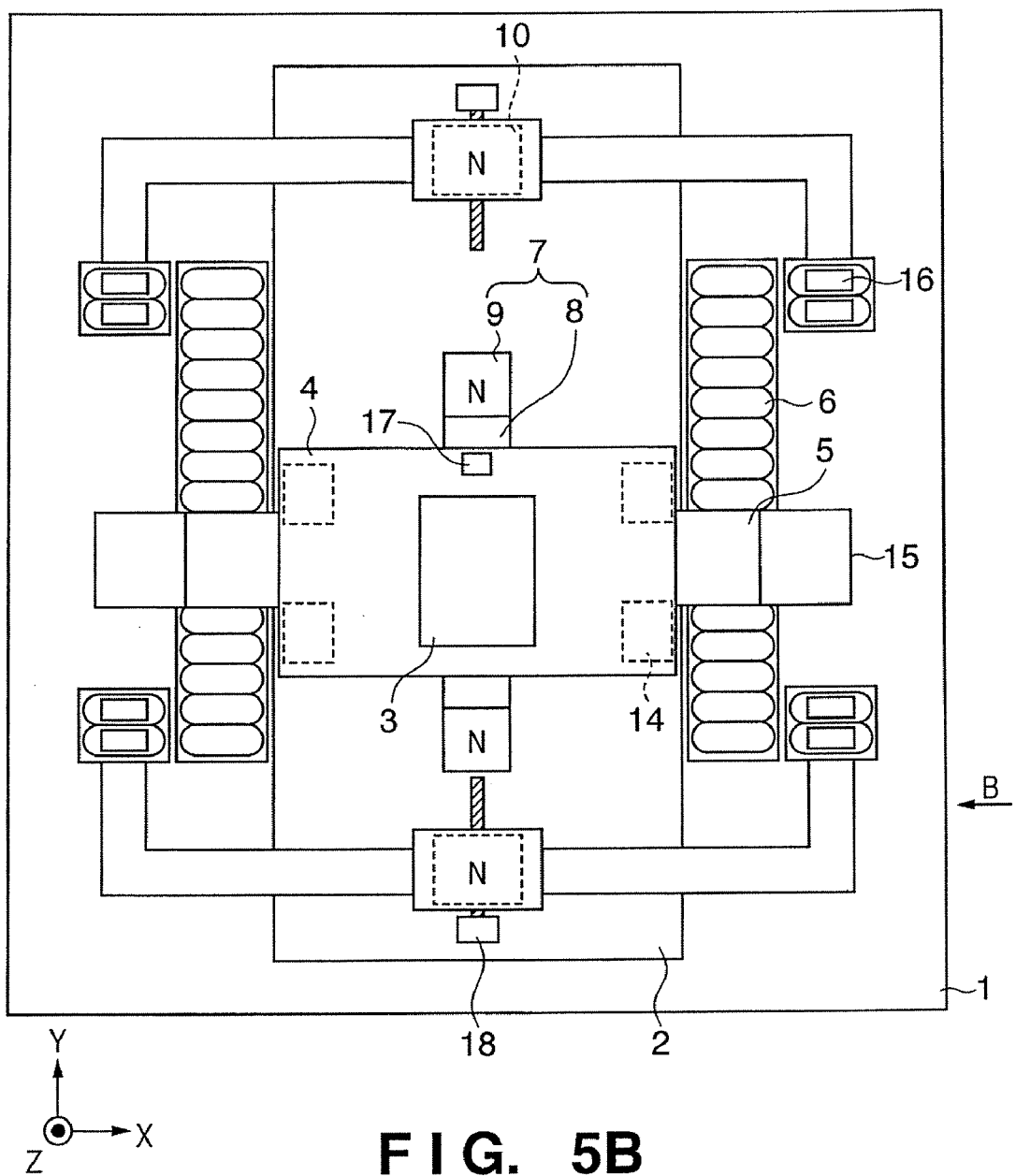
FIGS. 5A and 5B are views showing the arrangement of a positioning apparatus according to the third embodiment of the present invention.
Figure 5B:
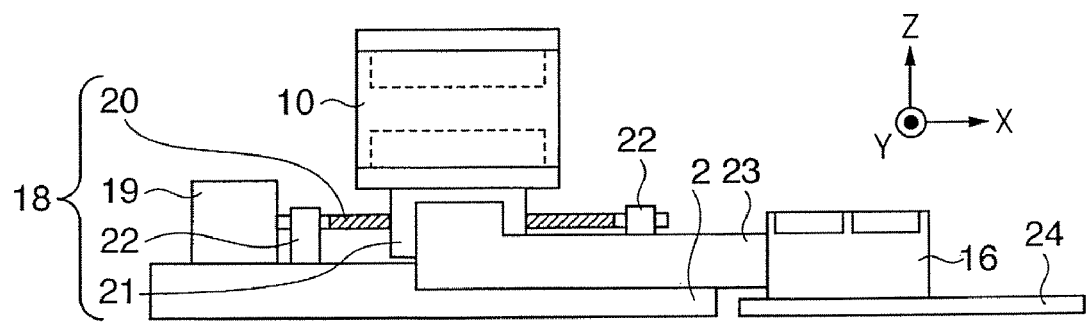
Figure 6A:
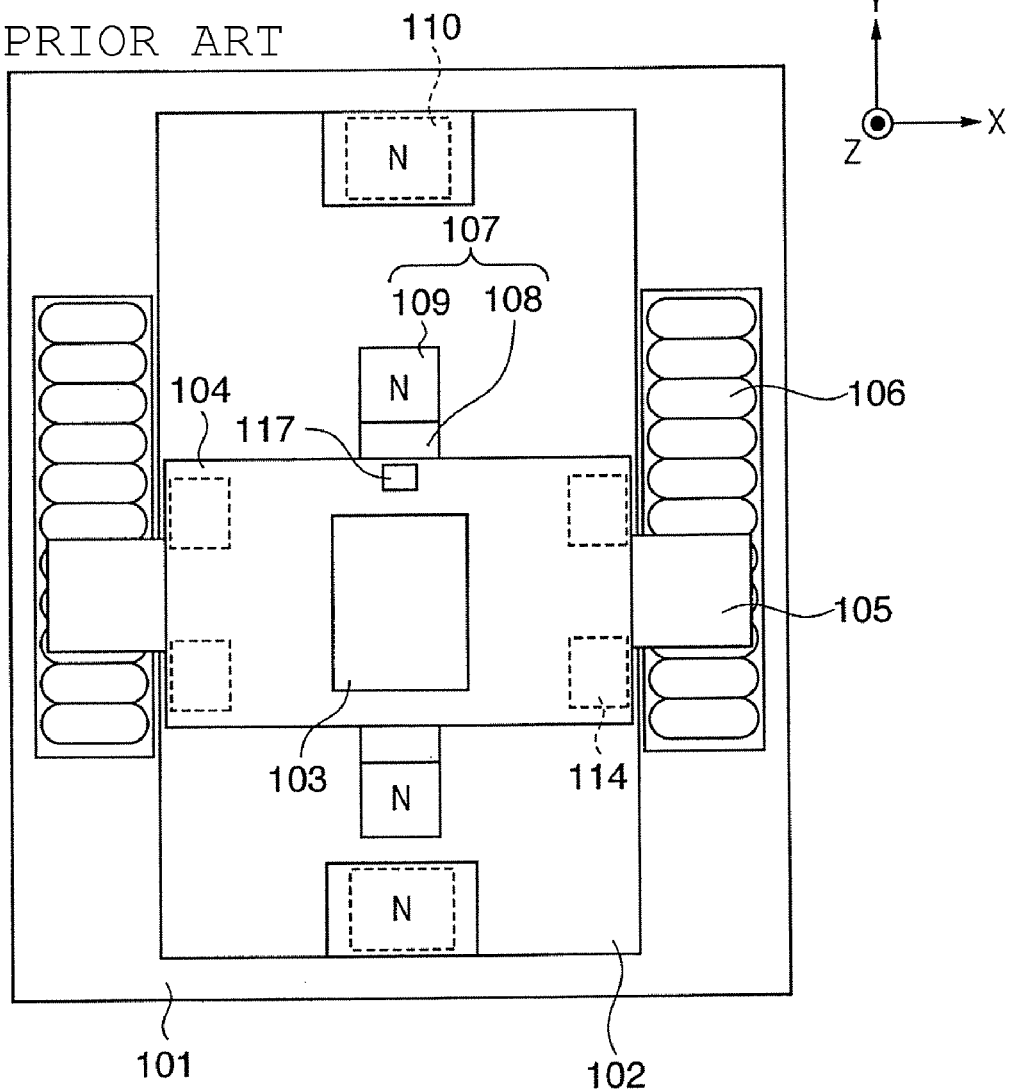
FIGS. 6A and 6B are views showing the arrangement of a conventional positioning apparatus.
Figure 6B:
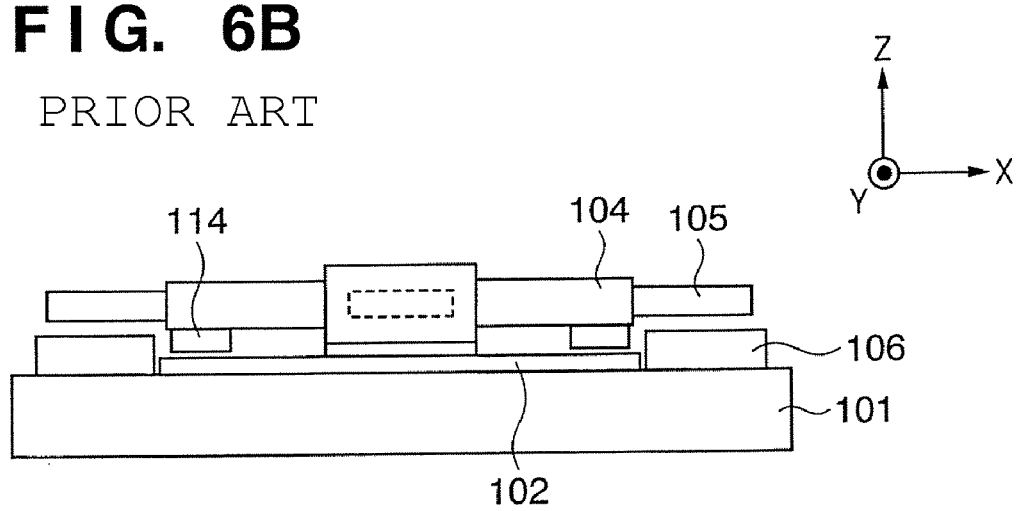
Figure 7:
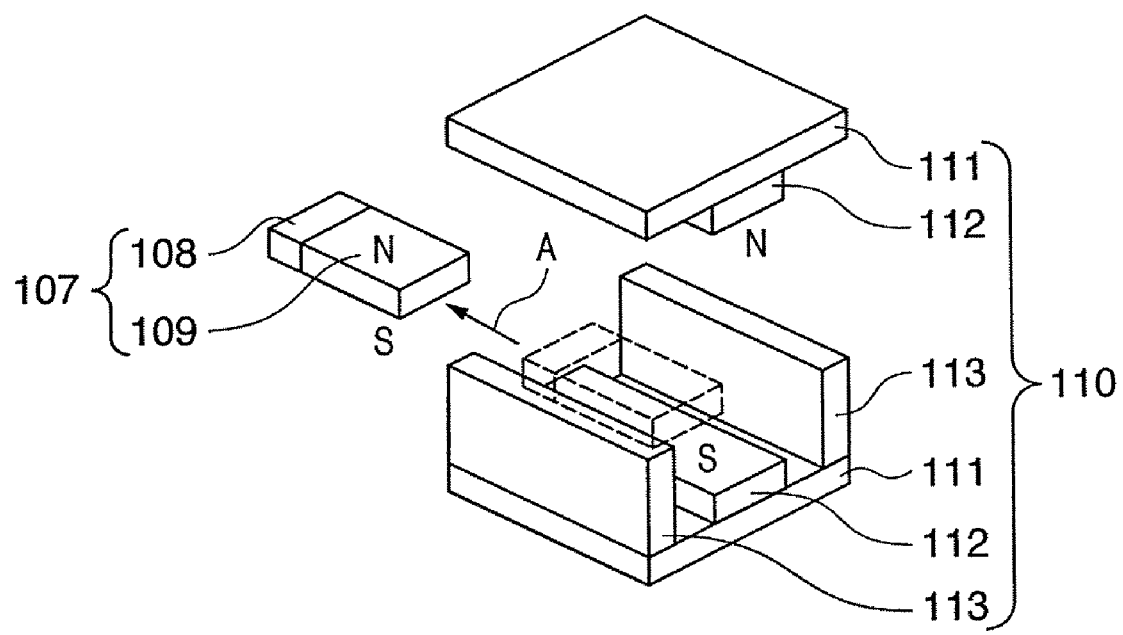
FIG. 7 is a view showing the arrangement of a repulsion magnet unit in the conventional positioning apparatus.

FIGS. 5A and 5B show the arrangement of a positioning apparatus according to the third embodiment. FIG. 5A is a plan view, and FIG. 5B is a side view of the main part around a repulsion stator 10 viewed from the direction indicated by an arrow B in FIG. 5A.

An operation for accelerating/decelerating a stage 4 by a repulsion magnet unit is the same as those in the first and second embodiments.

Assume that the positioning apparatus according to an embodiment is applied to a reticle stage of a semiconductor exposure apparatus, that is, that the stage 4 is applied to a reticle stage of a semiconductor exposure apparatus. Changing the amount of insertion of a repulsion movable element 7 makes it possible to change the maximum speed of the reticle stage. In other words, to change the dose amount during exposure, it suffices to change the amount of insertion of the repulsion movable element 7 in the repulsion stator 10 of the repulsion magnet unit.

Assume also that the entire pattern of a reticle serving as a processing object 3 is not transferred by exposure, that is, that a part (e.g., half) of the pattern is transferred by exposure. In this case, it is necessary to change the acceleration/deceleration start position of the stage 4 which moves reciprocally. The above-described embodiments have exemplified the case wherein the repulsion stators 10 are fixed at the two ends of the base guide 2. In the third embodiment, however, it is possible to adjust the positions of the repulsion stator 10 and a large-thrust linear motor stator 16. FIG. 5B shows the arrangement of an adjusting mechanism 18 which adjusts the positions of the repulsion stator 10 and large-thrust linear motor stator 16 using a known screw feed mechanism. An actuating motor 19 and feed screw supporting units 22 are fixed on a base guide 2. As the actuating motor 19 rotates, a feed screw 20 connected coaxially with it rotates so as to adjust the position of the repulsion stator 10 via a feed screw nut 21. The large-thrust linear motor stator 16 is arranged on a guide 24 and connected to the repulsion stator 10 via a connecting member 23. This makes it possible to simultaneously move the repulsion stator 10 and large-thrust linear motor stator 16 by the same amount. An encoder (not shown) built in the actuating motor 19 can detect the positions of the repulsion stator 10 and large-thrust linear motor stator 16.

This arrangement can change the acceleration/deceleration start position of the stage 4 which moves reciprocally so as to immediately cope with, for example, a case wherein a part of the pattern of the reticle is to be transferred by exposure.

Fourth Embodiment

An exemplary exposure apparatus to which a positioning apparatus according to the present invention is applied will be explained below.

Figure 8:
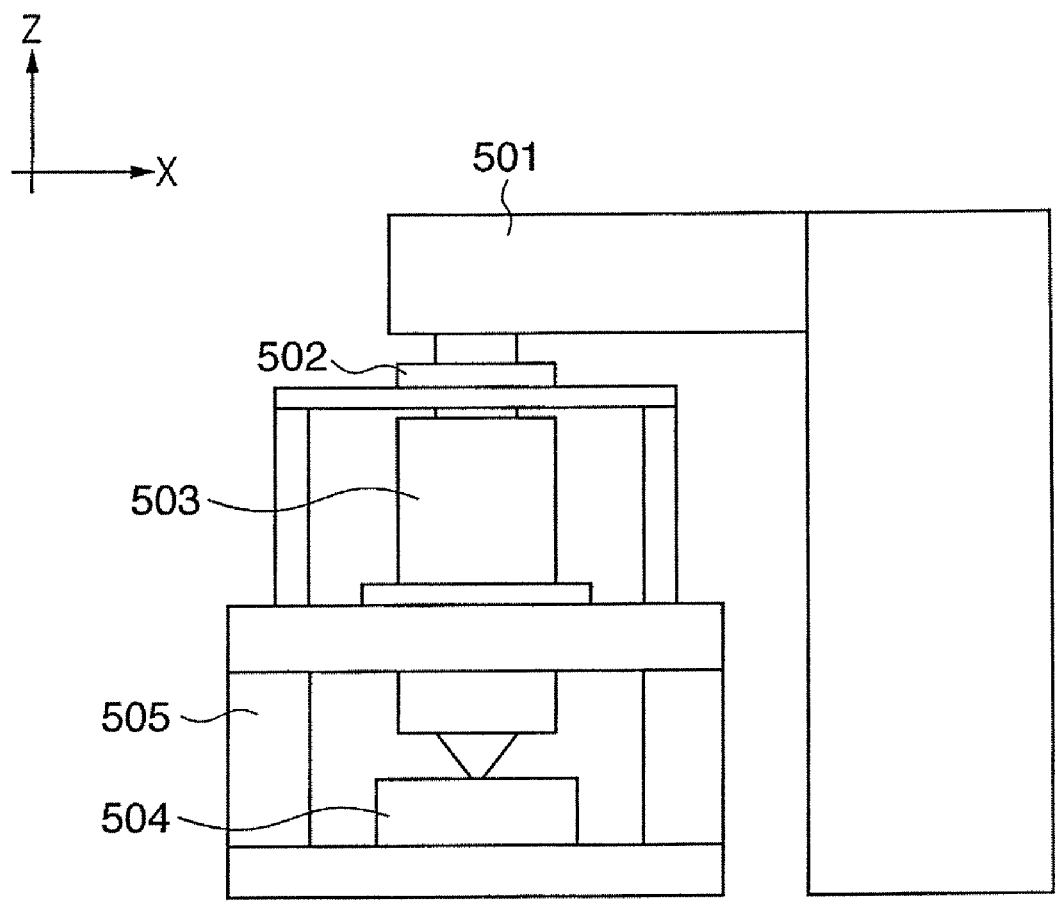
FIG. 8 is a view showing the arrangement of an exposure apparatus according to the fourth embodiment of the present invention.

As shown in FIG. 8, the exposure apparatus comprises an illumination device 501, a reticle stage 502 which supports a reticle, a projection optical system 503, and a wafer stage 504 which supports a wafer. The exposure apparatus projects the circuit pattern formed on the reticle onto the wafer by exposure, and may be of a step & repeat projection exposure scheme or step & scan projection exposure scheme.

The illumination device 501 illuminates the reticle on which the circuit pattern is formed, and comprises a light source unit and illumination optical system. The light source unit uses, for example, a laser as a light source. The laser can use, for example, an ArF excimer laser with a wavelength of about 193 nm, a KrF excimer laser with a wavelength of about 248 nm, or an $F_2$ excimer laser with a wavelength of about 153 nm. The type of laser is not limited to an excimer laser and may use, for example, a YAG laser. The number of lasers is not limited, either. If the light source uses a laser, the illumination device 501 preferably uses a light beam shaping optical system for shaping a collimated light beam from the laser light source into a desired beam shape, and an incoherent optical system for converting a coherent laser light beam into an incoherent light beam. The light source usable for the light source unit is not limited to a laser, and one or a plurality of lamps such as mercury lamps or xenon lamps can be used. The illumination optical system illuminates a mask and includes, for example, a lens, mirror, light integrator, and stop.

The projection optical system 503 can use, for example, an optical system including only a plurality of lens elements, an optical system (catadioptric optical system) including a plurality of lens elements and at least one concave mirror, an optical system including a plurality of lens elements and at least one diffraction optical element such as a kinoform, or an optical system of a total reflection mirror type.

Linear motors, for example, can move the reticle stage 502 and wafer stage 504. If the exposure apparatus is of a step & scan projection exposure scheme, these stages move in synchronism with each other. An actuator is separately provided on at least one of the wafer stage and reticle stage to position the pattern of the reticle on the wafer. The stage 4 of the positioning apparatus as shown in FIGS. 1A and 1B, 4A and 4B, 5A and 5B, or 6A and 6B according to the above-described embodiments is applied to the reticle stage 502.

This exposure apparatus can be used to manufacture a device on which a micropattern is formed, for example, a semiconductor device such as a semiconductor integrated circuit, a micromachine, or a thin film magnetic head.

Fifth Embodiment

Figure 9:
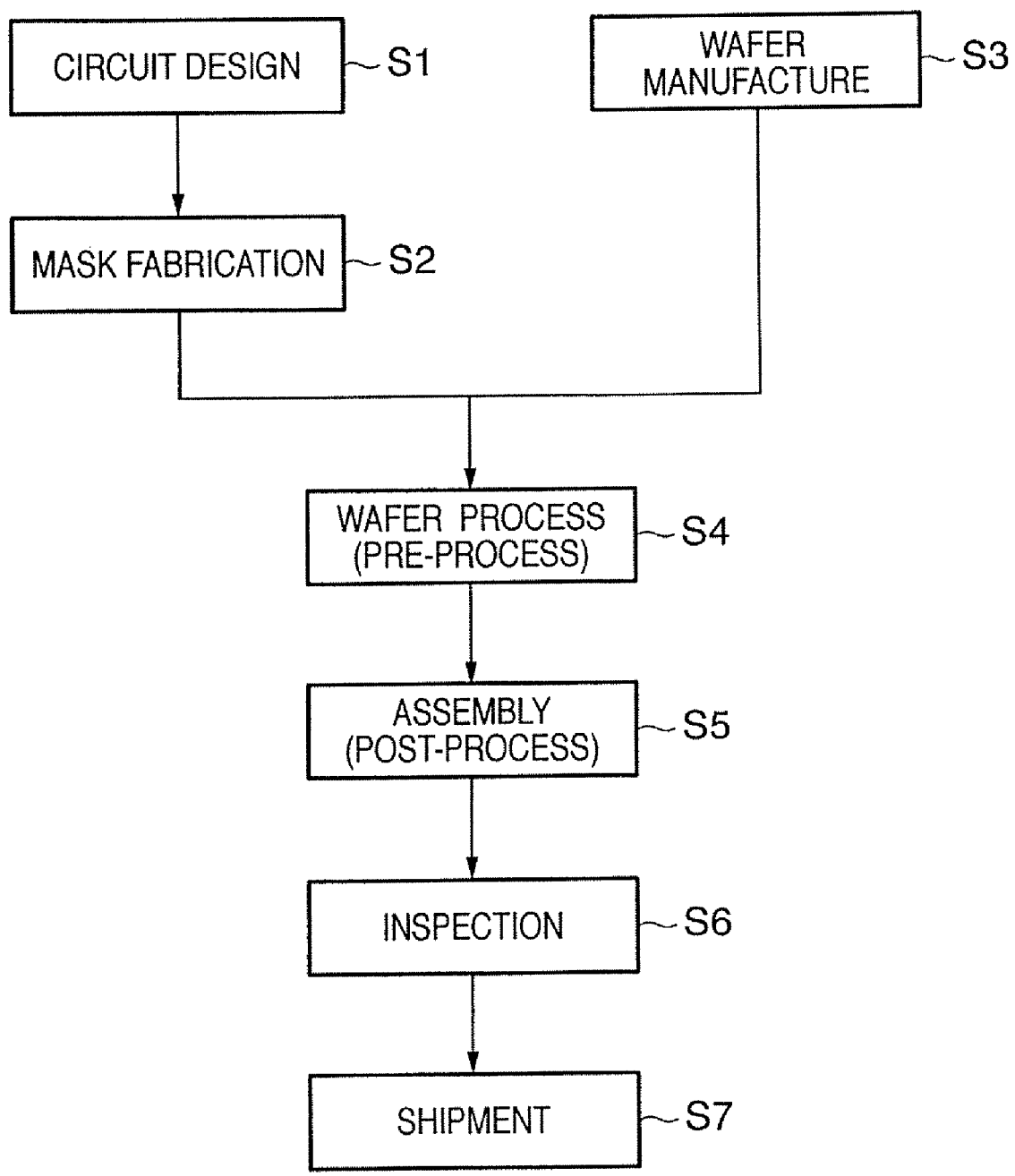
FIG. 9 is a flowchart for explaining device manufacture using an exposure apparatus.

An embodiment of a device manufacturing method using the above-described exposure apparatus will be explained next with reference to FIGS. 9 and 10. FIG. 9 is a flowchart for explaining the manufacture of a device (e.g., a semiconductor chip such as an IC or LSI, an LCD, or a CCD). A semiconductor chip manufacturing method will be exemplified here.

In step S1 (circuit design), the circuit of a semiconductor device is designed. In step S2 (mask fabrication), a mask is fabricated based on the designed circuit pattern. In step S3 (wafer manufacture), a wafer is manufactured using a material such as silicon. In step S4 (wafer process) called a pre-process, the above-described exposure apparatus forms an actual circuit on the wafer by lithography using the mask and wafer. In step S5 (assembly) called a post-process, a semiconductor chip is formed using the wafer manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 10:
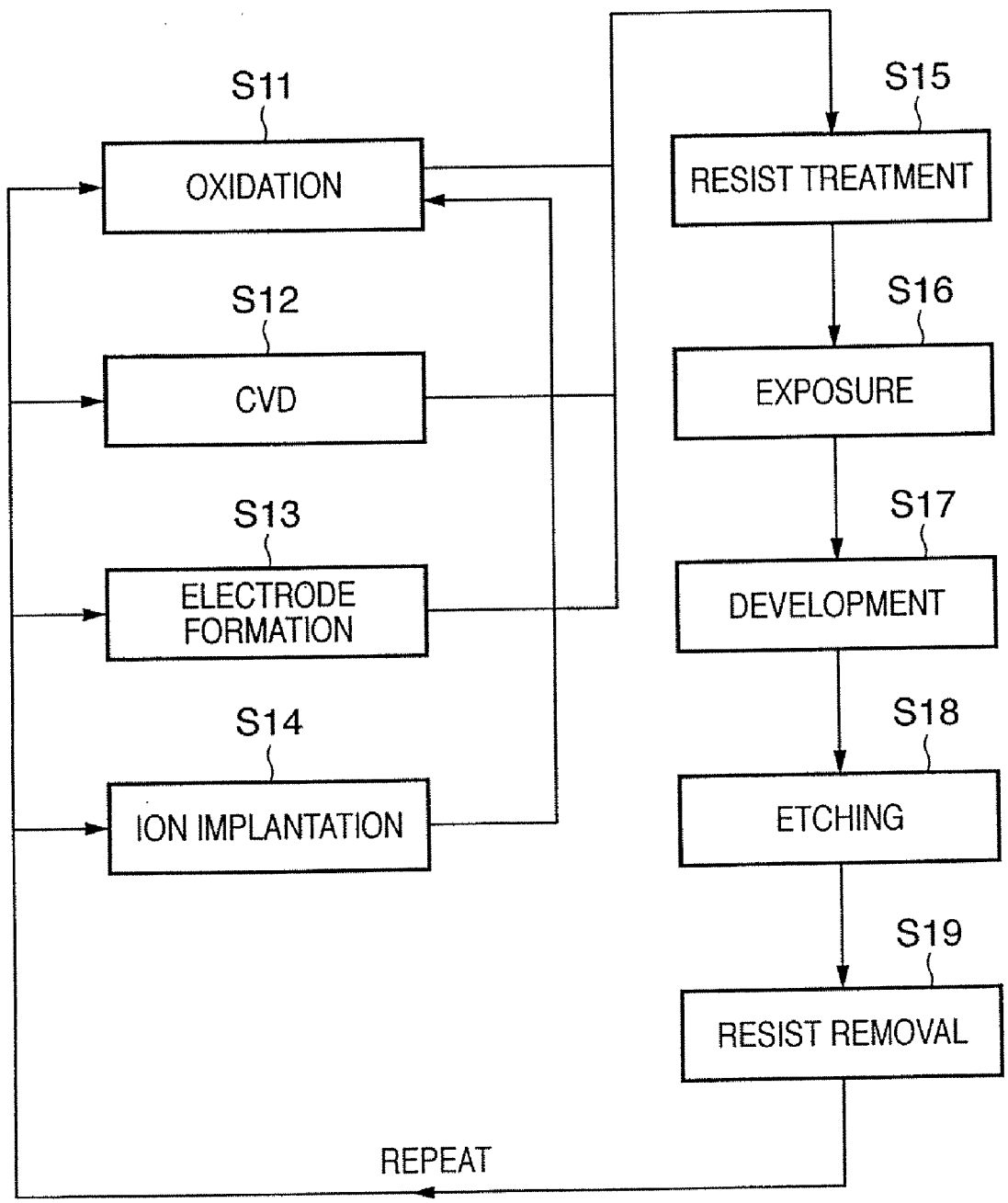
FIG. 10 is a flowchart illustrating details of the wafer process in step S4 of the flowchart shown in FIG. 9.

FIG. 10 is a flowchart illustrating details of the wafer process in step S4. In step S11 (oxidation), the wafer surface is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist process), a photosensitive agent is applied on the wafer. In step S16 (exposure), the exposure apparatus transfers the circuit pattern of the mask onto the wafer by exposure. In step S17 (development), the exposed wafer is developed. In step S18 (etching), portions other than the developed resist image are etched. In step S19 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-293154, filed Oct. 27, 2006, which is hereby incorporated by reference herein in its entirety.

What is claimed is:

1. A positioning apparatus which positions a stage that can move on a base guide in a first direction, the apparatus comprising:
    an actuating unit configured to reciprocally actuate the stage in the first direction;
    a repulsion force generation unit which includes a movable element arranged on the stage and a stator arranged on the base guide, and is configured to generate a repulsion force which acts against a thrust of the stage and corresponds to a facing area of a pair of magnets of the same polarity, said movable element and said stator being arranged so that said pair of magnets of the same polarity face each other at each actuation edge of the stage in the first direction; and
    a repulsion force assisting unit configured to assist the repulsion force by applying a thrust exceeding the repulsion force to the stage to increase the facing area of said pair of magnets of the same polarity,
    wherein said repulsion force assisting unit generates a thrust larger than a thrust generated by said actuating unit.

2. A positioning apparatus which positions a stage that can move on a base guide in a first direction, the apparatus comprising:
    an actuating unit configured to reciprocally actuate the stage in the first direction;
    a repulsion force generation unit which includes a movable element arranged on the stage and a stator arranged on the base guide, and is configured to generate a repulsion force which acts against a thrust of the stage and corresponds to a facing area of a pair of magnets of the same polarity, said movable element and said stator being arranged so that said pair of magnets of the same polarity face each other at each actuation edge of the stage in the first direction; and
    a repulsion force assisting unit configured to assist the repulsion force by applying a thrust exceeding the repulsion force to the stage to increase the facing area of said pair of magnets of the same polarity,
    wherein said actuating unit includes a linear motor of a coreless type, and
    wherein said repulsion force assisting unit includes a linear motor of a core type.

\* \* \* \* \*